United States Patent [19]

Baba

[11] 4,409,496

[45] Oct. 11, 1983

[54] MOS DEVICE INCLUDING A SUBSTRATE BIAS GENERATING CIRCUIT

[75] Inventor: Fumio Baba, Yokohama, Japan

[73] Assignee: Fujitsu Limited, Kawasaki, Japan

[21] Appl. No.: 232,032

[22] PCT Filed: Jun. 4, 1980

[86] PCT No.: PCT/JP80/00124

§ 371 Date: Feb. 5, 1981

§ 102(e) Date: Jan. 28, 1981

[87] PCT Pub. No.: WO80/02773

PCT Pub. Date: Dec. 11, 1980

[30] Foreign Application Priority Data

Jun. 5, 1979 [JP] Japan .................. 54-70382

[51] Int. Cl.³ .................. H03K 3/353; H03L 7/24
[52] U.S. Cl. .................. 307/296 R; 307/304; 307/449; 307/530
[58] Field of Search ......... 307/296 R, 297, 304, 307/449, 530

[56] References Cited

U.S. PATENT DOCUMENTS 3,845,331  10/1974  Luscher .................. 307/304
4,142,114  2/1979   Green .................... 307/297 X
4,208,595  6/1980   Gladstein et al. ......... 307/297
4,255,677  3/1981   Boonstra et al. .......... 307/304
4,311,923  1/1982   Lüscher et al. ........... 307/304

OTHER PUBLICATIONS

Jensen, "Substrate Voltage Generator Circuit", *IBM Tech. Disc. Bull.*, vol. 21, No. 2, Jul. 1978, pp. 727-728.

*Primary Examiner*—Larry N. Anagnos
*Assistant Examiner*—David R. Hudspeth
*Attorney, Agent, or Firm*—Staas & Halsey

[57] ABSTRACT

An MOS device including a substrate bias generating circuit, comprising: a clock generator for receiving an external clock signal and generating first and second internal clock signals; an internal circuit operated by the first and second internal clock signals; a pumping circuit driver for generating third and fourth internal clock signals in synchronization with the first and second internal clock signals and; a pumping circuit operated by the third and fourth internal clock signals. In this device, when the substrate potential ($V_{BB}$) is relatively high, currents flow from the substrate to the pumping circuit.

6 Claims, 13 Drawing Figures

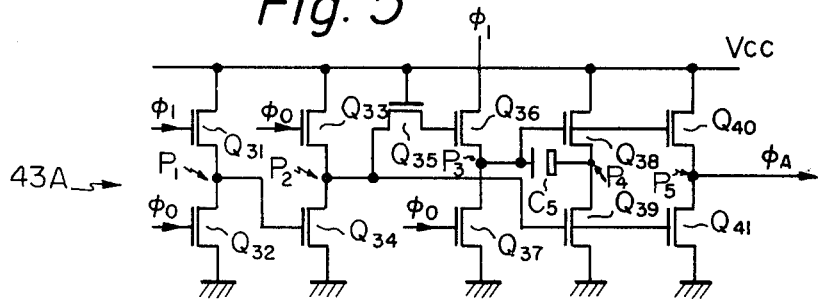
Fig. 5
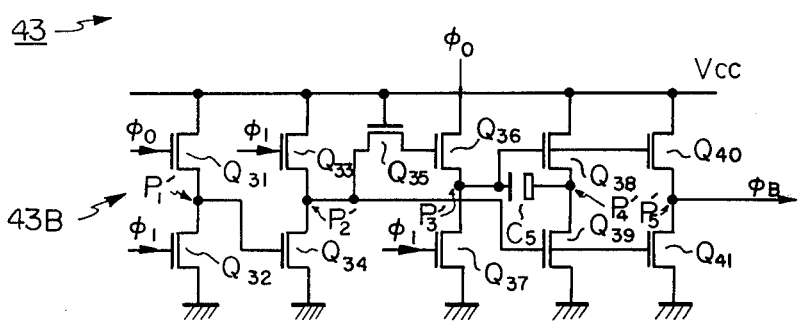
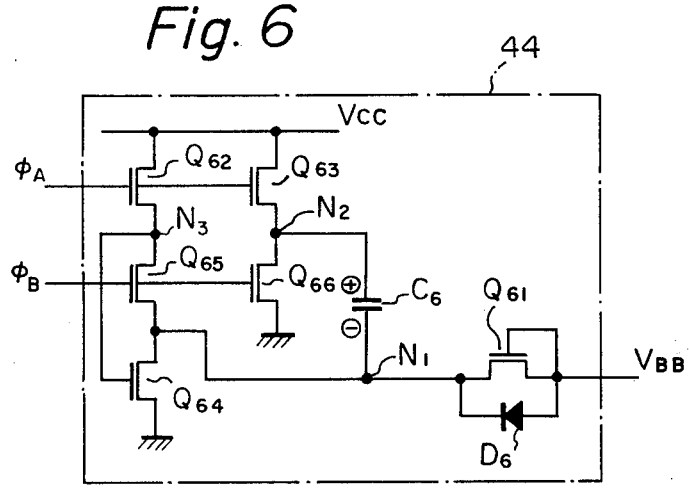
Fig. 6

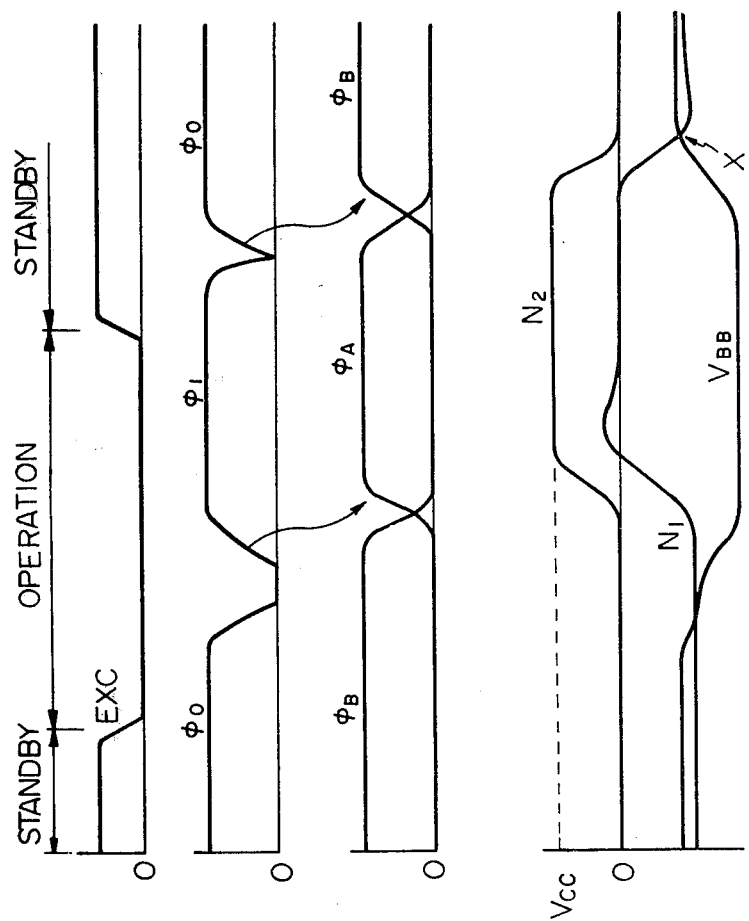

MOS DEVICE INCLUDING A SUBSTRATE BIAS GENERATING CIRCUIT

DESCRIPTION

1. Technical Field

The present invention relates to an MOS integrated circuit and, more particularly, to an MOS device including a substrate bias generating circuit formed in a chip.

2. Background Art

Generally, in an n-type MOS device, a negative bias voltage is applied to the substrate thereof, in order to suppress a source-substrate effect which affects threshold voltage and, in addition, in order to increase the operation speed of the device by decreasing junction capacitances between the substrate and each of the diffusion layers. For this purpose, one external power supply for the negative bias voltage is usually necessary. However, in recent years, a substrate bias generating circuit which is formed in a chip has been provided (Ref. U.S. Pat. No. 3,806,741). An MOS device having such a substrate bias generating circuit therein does not require the above-mentioned external power supply.

Usually, positive charges are generated in the substrate due to leakage currents through the p-n junctions between the substrate and each of the diffusion layers and due to impact ionization. The substrate bias generating circuit comprises a pumping circuit for absorbing such positive charges in the substrate. Thus, the potential of the substrate remains lower than a predetermined value. It should be noted that variation of the substrate potential occurs more or less in association with the operation of internal circuits, such as memory cells, decoders or the like.

However, in one prior art MOS device which includes a substrate bias generating circuit, the pumping operation by the pumping circuit is not in synchronization with the operation of the internal circuits. In this device, the pumping operation may be effected when the substrate potential is low. As a result, the efficiency of pumping is low, since the difference between the substrate potential and the lowest potential of the pumping circuit is small. In another prior art device, the pumping operation by the pumping circuit is independent from the magnitude of the potential of the substrate, even when the pumping operation is in synchronization with the operation of the internal circuits. In this device, the pumping operation may also be effected when the substrate potential is low. In any case, the efficiency of pumping is low and, accordingly, the average level of the substrate potential is relatively high, which invites incomplete isolation between elements, unstable threshold voltages and a low operation speed.

OBJECTS AND SUMMARY OF THE INVENTION

It is an object of the present invention to provide an MOS device including a substrate bias generating circuit with a low average level of the substrate potential.

Accordingly to the present invention, there is provided an MOS device including a substrate bias circuit, comprising: a clock generator for receiving an external clock signal and generating first and second internal clock signals; an internal circuit, connected to the clock generator, which is operated by the internal clock signals; a pumping circuit driver, connected to the clock generator, for receiving the internal clock signals and generating third and fourth internal clock signals which are in synchronization with the internal clock signals and are in opposite phase with each other; and, a pumping circuit, connected to the pumping circuit driver and driven by the third and fourth internal clock signals, for generating a substrate potential, the pumping operation of the pumping circuit being effected when the substrate potential is relatively high. In this device, the pumping efficiency is high; in other words, the quantity of charges flowing from the substrate to the pumping circuit is large since the pumping operation is effected when the substrate potential is high. Accordingly, the average level of the substrate potential can be decreased compared with those of the prior art.

The present invention will be more clearly understood from the description as set forth below with reference to the accompanying drawings.

BRIEF DESCRIPTION OF THE DRAWINGS

FIG. 5 is a circuit diagram of the pumping circuit driver 43 of FIG. 4;

FIG. 6 is a circuit diagram of the pumping circuit 44 of FIG. 4, and;

FIGS. 7A through 7D are timing diagrams showing the signals appearing in the circuits of FIGS. 4 and 6.

BEST MODE FOR CARRYING OUT THE INVENTION

Figure 1:
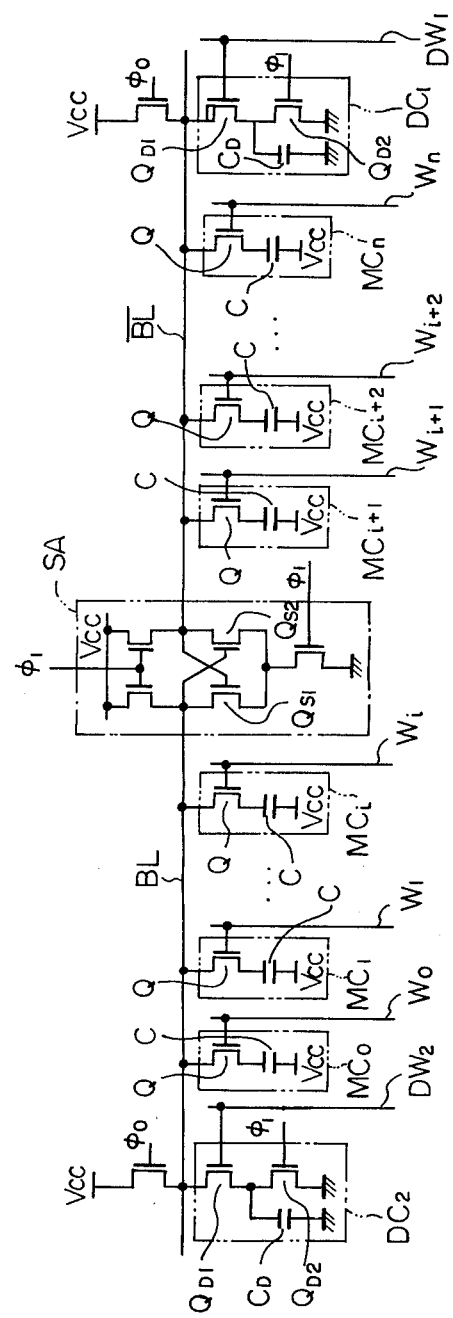
FIG. 1 is a circuit diagram illustrating a memory cell portion including a sense amplifier of an MOS dynamic memory, for explaining a variation of a substrate potential.

Referring to FIG. 1, which illustrates a memory cell portion, including a sense amplifier, of an MOS dynamic memory, each of the memory cells $MC_0$, $MC_1$, ..., $MC_i$, $MC_{i+1}$, $MC_{i+2}$, ..., $MC_n$, which is of a one-transistor type, comprises a transistor Q and a capacitor C. In addition, dummy cells $DC_1$ and $DC_2$ are provided. Since the charge stored in the capacitor C is distributed to floating capacitances of bit lines BL, and $\overline{BL}$ the resulting difference in potential between the bit lines BL and $\overline{BL}$ are very small. During standby time, the potential of a clock $\phi_0$ is high, so that the bit lines $\overline{BL}$ and BL are precharged, while, during a reading operation time, the potential of the clock $\phi_1$ is high, so that data is introduced from a selected memory cell to the bit lines BL and $\overline{BL}$ and, after that, the data is read out by a sense amplifier SA.

Figure 3:
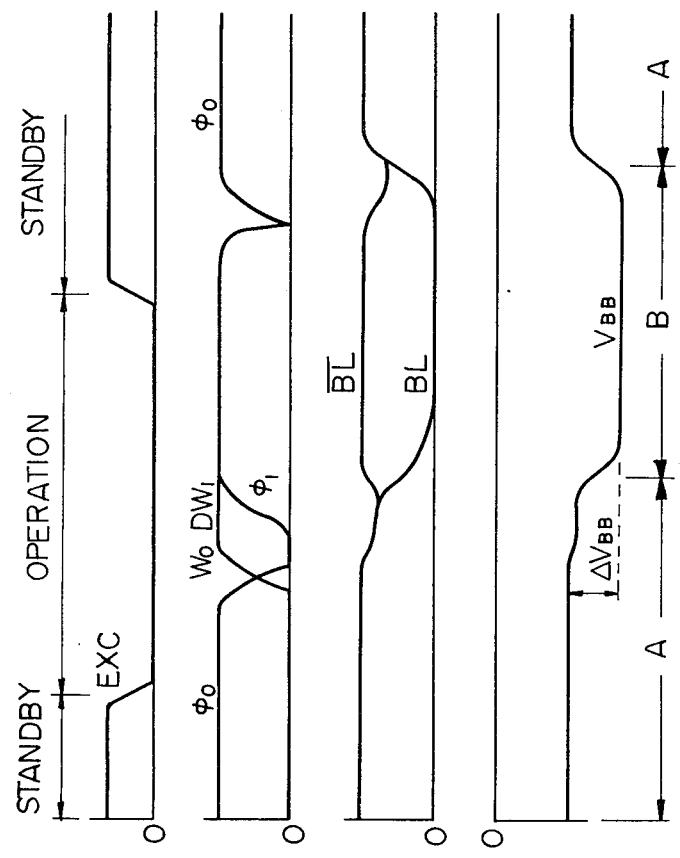
FIGS. 3A through 3D are timing diagrams showing the signals appearing in the circuits of FIGS. 1 and 2.

Referring to FIGS. 3A through 3C, the operation of the circuit of FIG. 1 is explained. It is assumed that the content stored in the memory cell $MC_0$ is read out in synchronization with an external clock signal EXC, as shown in FIG. 3A. In this case, as illustrated in FIG. 3B, the potential of the internal clock signal $\phi_0$ becomes low and, simultaneously, the potentials of a word line $W_0$ and a dummy word line $DW_1$ become high. As a result, the transistor Q of the memory cell $MC_0$ turns on so that the capacitor C is connected to the bit line BL, while a transistor $Q_{D1}$ of the dummy cell $DC_1$ turns on so that the capacitor $C_D$ is connected to the bit lines $\overline{BL}$. Therefore, if the charge stored in the capacitor C of the memory cell $MC_0$ is zero, the potential of the bit line BL becomes low, as illustrated in FIG. 3C. In the sense amplifier SA, the transistors $Q_{S1}$ and $Q_{S2}$ are conductive and non-conductive, respectively. As a result, the charge in the bit line BL flows through the transistor $Q_{S1}$ so that the potential of the bit line BL becomes lower. Therefore, as illustrated in FIG. 3C, the difference in potential between the bit lines BL and $\overline{BL}$ becomes larger. This difference is detected by a read amplifier (not shown) which means that the read operation for the content in the memory cell $MC_0$ is completed. After that, the potentials of the word line $W_0$ and the dummy word line $W_{D1}$ becomes low again and, accordingly, the bit lines BL and $\overline{BL}$ are again precharged. Such changes of the potentials of the bit lines invite a variation of a substrate potential, since the bit lines are usually formed by diffusion layers in the substrate, and junction capacitances between the diffusion layers and the substrate are large.

Figure 2:
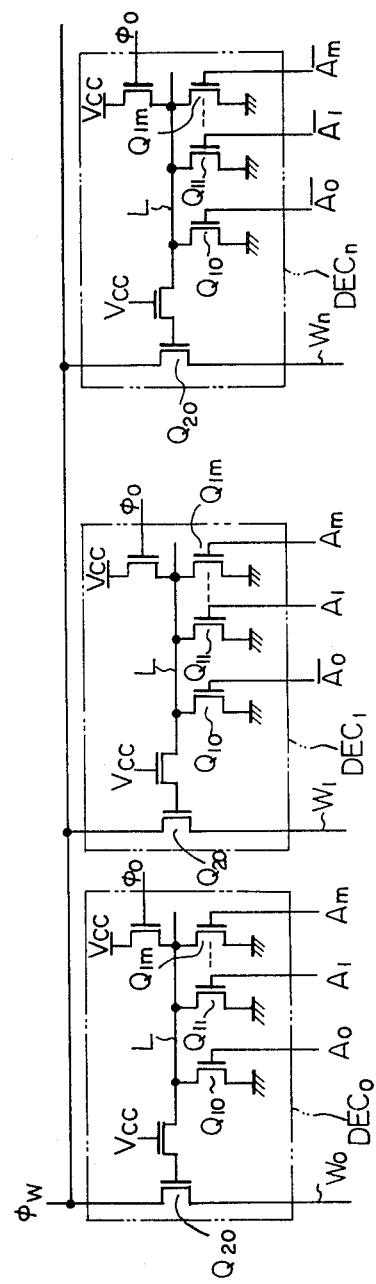
FIG. 2 is a circuit diagram illustrating a decoder portion of the MOS dynamic memory, for explaining another variation of the substrate potential.

FIG. 2 is also a circuit diagram illustrating a decoder portion of the MOS dynamic memory and used for explaining a variation of the substrate potential. In FIG. 2, word lines $W_0, W_1, \ldots, W_n$ are the same as those of FIG. 1. $\phi_W$ indicates a power supply for the decoders. The selection of the word lines $W_0, W_1, \ldots, W_n$ is carried out by address signals $A_0, A_1, \ldots, A_m$ and their inverted signals $\overline{A_0}, \overline{A_1}, \ldots, \overline{A_m}$. For example, in a decoder $DEC_0$, if all the potentials of the address signals $A_0, A_1, \ldots, A_m$ are low, the transistors $Q_{10}, Q_{11}, \ldots, Q_{1m}$ are non-conductive, so that the potential of a signal line L remains high. Therefore, the transistor $Q_{20}$ is conductive, so that the potential of the word line $W_0$ is high, which means that a word line $W_0$ is selected. Contrary to this, if the potential of at least one of the address signals $A_0, A_1, \ldots, A_m$ is high, the corresponding transistors $Q_{10}, Q_{11}, \ldots, Q_{1m}$ conduct so that the potential of the signal line L becomes low. Therefore, the transistor $Q_{20}$ is non-conductive so that the potential of the word line $W_0$ is low, which means that the word line $W_0$ is non-selected. In such decoders $DEC_0, DEC_1, \ldots, DEC_n$, the signal line L is precharged by the internal clock signal $\phi_0$, as illustrated in FIG. 3B. For the non-selected state, the potential of the signal line L becomes low and, after that, the signal line L is again precharged by the high potential of the clock signal $\phi_0$. Such a change of the potential of the signal line L also invites a variation of the substrate potential, since the signal line L is usually formed by a diffusion layer in the substrate, and the junction capacitance between the diffusion layer and the substrate is large.

In the MOS dynamic memory, as explained above, changes of the junction capacitances between the substrate and the diffusion layers forming the bit lines BL, $\overline{BL}$ and, the signal lines L are generated and, similarly, changes of the junction capacitances between the substrate and source or drain diffusion layers are generated. As a result, the substrate potential $V_{BB}$ is changed, as illustrated in FIG. 3D. For example, in a 64K bit dynamic memory using a 5 volt power supply, the variation $\Delta V_{BB}$ of the substrate potential $V_{BB}$ is 1 or 2 volts.

There is no problem when the substrate potential $V_{BB}$ is low, but there are various problems when the substrate potential $V_{BB}$ is high. Firstly, the p-n junction between the substrate and source or drain region is forward biased and, accordingly, isolation between the substrate and each of the elements is incomplete. Secondly, the circuit operation becomes unstable when the substrate potential $V_{BB}$ approaches zero, since the variation of a threshold voltage is inversely proportional to a value $\sqrt{|V_{BB}|}$. Thirdly, when the substrate potential $V_{BB}$ becomes high, junction capacitances between the substrate and each of the diffusion layers also become large, so that the circuit operation becomes slow and unstable.

On the other hand, in the prior art, the pumping operation by the substrate bias generating circuit, which absorbs positive charges from the substrate, is not in synchronization with the operation of internal circuits, such as memory cells or decoders. In this case, the substrate potential $V_{BB}$ is altered responsive to a ratio between the periods A and B, as illustrated in FIG. 3D. For example, if the period B is much longer than the period A, most of the pumping operations may be carried out during the period B, which invites a high average level of the substrate potential $V_{BB}$. In addition, even when the pumping operation is in synchronization with the operation of the internal circuits, it is of no use that the pumping operation is carried out during the period B. Contrary to this, in the present invention, the pumping operation is in synchronization with the operation of the internal circuits and, in addition, the pumping operation is always carried out during the period A.

Figure 4:
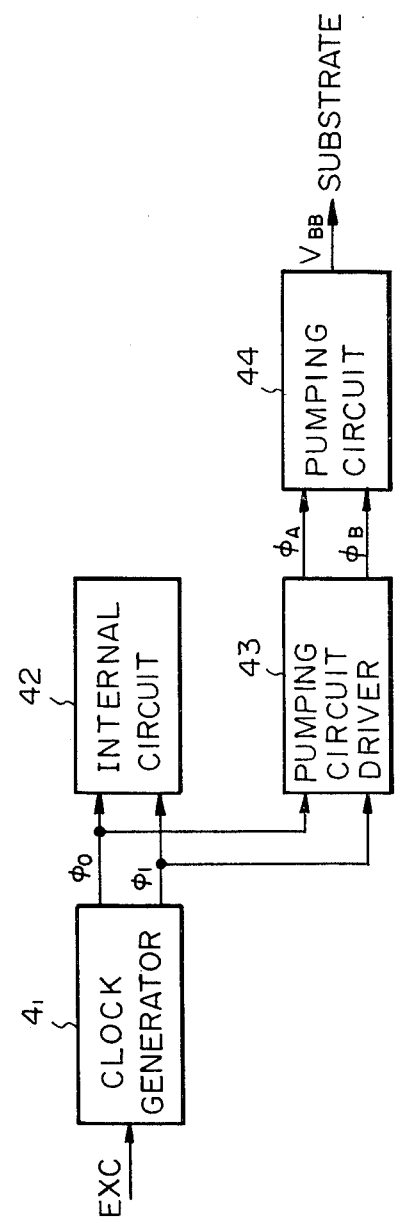
FIG. 4 is a block diagram illustrating an embodiment of the MOS device including a substrate bias generating circuit according to the present invention.

FIG. 4 is a block diagram illustrating an embodiment of the MOS device including a substrate bias generating circuit according to the present invention. In FIG. 4, a clock generator 41, an internal circuit 42 such as memory cells or decoders, a pumping circuit driver 43 and a pumping circuit 44 are formed in a chip. The clock generator 41 receives an external clock signal EXC as shown in FIG. 7A and generates first and second internal clock signals $\phi_0$ and $\phi_1$, as shown in FIG. 7B, to the internal circuit 42 and the pumping circuit driver 43. The pumping circuit driver 43 delays the internal clock signals $\phi_0$ and $\phi_1$ for a predetermined time and generates third and fourth internal clock signals $\phi_A$ and $\phi_B$, as shown in FIG. 7C, which are in opposite phase with each other, and are input to the pumping circuit 44. Therefore, the internal clock signals $\phi_A$ and $\phi_B$ are in synchronization with the rising of the internal clock signals $\phi_1$ and $\phi_0$, respectively. In addition, the time delay caused by the pumping circuit driver 43 is determined to be a value which insures that the pumping operation of the pumping circuit 44 is carried out when the substrate potential $V_{BB}$ is high.

FIG. 5 is a circuit diagram of the pumping circuit driver 43 of FIG. 4. The pumping circuit driver 43 comprises a portion 43A for generating the clock signal $\phi_A$ and a portion 43B for generating the clock $\phi_B$ signal. Both comprise the same components. Each of the parts 43A and 43B comprises five pairs of series-connected transistors $Q_{31}$ and $Q_{32}$, $Q_{33}$ and $Q_{34}$, $Q_{36}$ and $Q_{37}$, $Q_{38}$ and $Q_{39}$, and $Q_{40}$ and $Q_{41}$, a transistor $Q_{35}$ connected between the node $P_2$ and the gate of the transistor $Q_{36}$, and a capacitor $C_5$ connected between the gate and the source of the transistor $Q_{38}$. Here, the transistor $Q_{34}$ serves as an element for determining the delay time of the pumping circuit driver 43. For example, in the generating portion 43A, when the potentials of the clock signals $\phi_0$ and $\phi_1$ are high and low, respectively, the transistors $Q_{32}$, $Q_{33}$, $Q_{36}$ and $Q_{37}$ are conductive, while the transistor $Q_{31}$ is non-conductive. Therefore, the potential at the node $P_1$ becomes low and the transistor $Q_{34}$ turns off so that the potential at the node $P_2$ becomes high. Therefore, the transistors $Q_{39}$ and $Q_{41}$ are conductive. On the other hand, since the transistor $Q_{36}$ is conductive and the potential of the clock signal $\phi_1$ is low, the potential at the node $P_3$ remains low and, accordingly, the transistors $Q_{38}$ and $Q_{40}$ are non-conductive. As a result, the potentials at the nodes $P_4$ and $P_5$ are low and, accordingly, the potential of the clock signal $\phi_A$ is low. Contrary to this, in the generating portion 43B, the potential of the clock signal $\phi_B$ is high.

Similarly, when the potentials of the clock signals $\phi_0$ and $\phi_1$ are low and high, respectively, the potentials of the clock signals $\phi_A$ and $\phi_B$ are high and low, respectively. It should be noted that, when both of the potentials of the clock signals $\phi_0$ and $\phi_1$ are low, the potentials of the clock signals $\phi_A$ and $\phi_B$ remain responsive to previous states of the clock signals $\phi_0$ and $\phi_1$. Therefore, the clock signals $\phi_A$ and $\phi_B$ are in synchronization with the rising of the clock signal $\phi_1$ and $\phi_0$, respectively (which are not always in opposite phase with each other), and are in opposite phase with each other.

FIG. 6 is a circuit diagram of the pumping circuit 44 of FIG. 4. In FIG. 6, a transistor $Q_{61}$, a diode $D_6$ and a capacitor $C_6$ serves as a pump for absorbing positive charges from the substrate. Transistors $Q_{62}$ through $Q_{65}$ are switching elements for charging the capacitor $C_6$ and operating the above-mentioned pump. Referring to FIG. 7D, the operation of the circuit of FIG. 6 is explained. When the potentials of the clock signals $\phi_A$ and $\phi_B$ are high and low, respectively, the transistors $Q_{62}$ and $Q_{63}$ are conductive and, accordingly, the transistor $Q_{64}$ which receives the high potential at the node $N_3$ is conductive. In addition, the transistors $Q_{65}$ and $Q_{66}$ are non-conductive. Therefore, the potential at the node $N_1$ approaches zero, while the potential at the node $N_2$ approaches a power supply voltage $V_{CC}$, so that the capacitor $C_6$ is charged. In this case, since the substrate potential $V_{BB}$ remains negative, no current flows from the substrate to the node $N_1$.

Next, when the potentials of the clock signals $\phi_A$ and $\phi_B$ are changed to low and high, respectively, the transistors $Q_{62}$ and $Q_{63}$ turn off and the transistors $Q_{65}$ and $Q_{66}$ conduct. As a result, the potential at the node $N_3$ becomes the same as that at the node $N_1$ and the transistor $Q_{64}$ turns off. Therefore, the potential at the node $N_2$ approaches zero. Since the transistor $Q_{64}$ is non-conductive, the potential at the node $N_1$ becomes a negative value. As a result, when the potential at the node $N_1$ becomes lower than the substrate potential $V_{BB}$, currents flow from the substrate to the node $N_1$ so that the substrate potential $V_{BB}$ is decreased. In the present invention, when the substrate potential $V_{BB}$ becomes high due to noise associated with the operation of the internal circuit, as illustrated by an arrow X in FIG. 7D, currents begin to flow from the substrate to the node $N_1$.

In FIG. 7D, if the substrate potential $V_{BB}$ remains low at the time indicated by the arrow X, the substrate potential $V_{BB}$ is lower than the potential at the node $N_1$ so that no pumping operation is carried out. However, in the present invention, such a phenomenon can rarely happen. Therefore, the efficiency of the pumping operation according to the present invention is high. As explained hereinbefore, the MOS device including a substrate bias generating circuit according to the present invention has such an advantage, as compared with those of the prior art, that the average level of the substrate potential can be decreased, because, when the substrate potential is high, currents flow from the substrate to the substrate bias generating circuit (the pumping circuit).

I claim:

1. An MOS device including a substrate bias circuit for controlling the potential on a substrate containing said MOS device, comprising:
    a clock generator for receiving an external clock signal and generating first and second internal clock signals;
    a circuit internal to said MOS device connected to said clock generator and operated by said first and second internal clock signals;
    a pumping circuit driver, connected to said clock generator, for receiving said first and second internal clock signals and generating third and fourth internal clock signals which are in synchronization with said first and second internal clock signals and are in opposite phase with each other; and
    a pumping circuit connected to said pumping circuit driver and said substrate and driven by said third and fourth internal clock signals, for generating a potential for biasing said substrate when said pumping circuit effectuates a pumping operation, said pumping circuit effecting said pumping operation when the potential on said substrate is higher than a predetermined value.

2. A device as set forth in claim 1, wherein said internal circuit is a memory cell array including a sense amplifier.

3. A device as set forth in claim 1, wherein said internal circuit is a decoder circuit.

4. A device as set forth in claim 1, wherein said pumping circuit comprises:
    a transistor having first, second and third terminals, said first and second terminals connected to said substrate of said MOS device;
    a diode operatively connected to said first and third terminals of said transistor;
    a capacitor having a first terminal operatively connected to said diode and the third terminal of said transistor to form a node and having a second terminal, said transistor, said diode and said capacitor serving as a pump for absorbing positive charges in said substrate; and
    a plurality of switching transistors operatively connected to said pumping circuit driver and said second terminal of said capacitor for receiving said third and fourth internal clock signals and actuating said pump.

5. A device as set forth in claim 4, wherein said pump operates only when the potential at said node is less than the potential on said substrate.

6. A device as set forth in claim 1, 2, 3 or 4, wherein said pumping circuit operates only when said first internal clock signal is at a high potential with respect to said second internal clock signal.

* * * * *

UNITED STATES PATENT AND TRADEMARK OFFICE
CERTIFICATE OF CORRECTION

PATENT NO. : 4,409,496
DATED : October 11, 1983
INVENTOR(S) : Fumio Baba

It is certified that error appears in the above-identified patent and that said Letters Patent is hereby corrected as shown below:

Front page, [75] Inventor, "Yokohama" should be --Kawasaki--.
Column 2, line 53, "a" should be --the--;
line 54, "of the" should be --of a--.
Column 3, line 15, "becomes" should be --become--;

line 28, "$\bar{A}_0, \bar{A}_1, ..., \bar{A}_m$" should be --$A_0, A_1, ..., A_m$-- line 29, "$A_0, A_1, ..., A_m.$" should be --$\bar{A}_0, \bar{A}_1, ..., \bar{A}_m.$--

Column 4, line 52, "$\phi_B$" should be --signal $\phi_B$--.

line 52, after "$\phi_B$" delete "signal".

Signed and Sealed this

Sixth Day of March 1984

[SEAL]

*Attest:*

*Attesting Officer*

GERALD J. MOSSINGHOFF
*Commissioner of Patents and Trademarks*